United States Patent
Dotson

(10) Patent No.: US 6,883,132 B1
(45) Date of Patent: Apr. 19, 2005

(54) PROGRAMMABLE ERROR CHECKING VALUE CIRCUIT AND METHOD

(75) Inventor: Gary Dan Dotson, Muskego, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 337 days.

(21) Appl. No.: 09/675,855

(22) Filed: Sep. 29, 2000

(51) Int. Cl.$^7$ .............................................. H03M 13/00
(52) U.S. Cl. ..................................................... 714/774
(58) Field of Search ......................................... 714/774

(56) References Cited

U.S. PATENT DOCUMENTS

| | | | |
|---|---|---|---|
| 4,216,540 A | * 8/1980 | McSpadden | 714/774 |
| 4,314,335 A | 2/1982 | Pezzi | |
| 4,325,119 A | 4/1982 | Grandmaison et al. | 710/5 |
| 4,604,748 A | * 8/1986 | Sato | 714/704 |
| 4,639,863 A | * 1/1987 | Harrison et al. | 360/97.01 |
| 4,713,605 A | 12/1987 | Iyer et al. | 324/73.1 |
| 4,771,429 A | 9/1988 | Davis et al. | 714/739 |
| 4,780,814 A | 10/1988 | Hayek | 710/105 |
| 4,819,153 A | * 4/1989 | Graham et al. | 360/69 |
| 4,924,380 A | 5/1990 | McKinney et al. | |
| 5,130,990 A | * 7/1992 | Hsu et al. | 714/784 |
| 5,138,620 A | 8/1992 | Miyazaki | 714/775 |
| 5,301,333 A | 4/1994 | Lee | |
| 5,327,436 A | 7/1994 | Miyazaki | 714/775 |
| 5,655,151 A | 8/1997 | Bowes et al. | 395/842 |
| 5,729,702 A | 3/1998 | Creedon et al. | |
| 5,832,278 A | 11/1998 | Pham | |
| 5,928,372 A | 7/1999 | Yoshida | 714/704 |
| 6,006,303 A | 12/1999 | Barnaby et al. | |
| 6,023,738 A | 2/2000 | Priem et al. | 710/23 |
| 6,026,443 A | 2/2000 | Oskouy et al. | 709/230 |
| 6,088,517 A | 7/2000 | Wanner et al. | 395/290 |
| 6,092,116 A | 7/2000 | Earnest et al. | 709/236 |
| 6,092,231 A | 7/2000 | Sze | 714/758 |
| 6,385,751 B1 | * 5/2002 | Wolf | 714/784 |

* cited by examiner

Primary Examiner—Joseph D. Torres
(74) Attorney, Agent, or Firm—Amin & Turocy LLP; Alexander M. Gerasimow

(57) ABSTRACT

An arbiter system comprises a plurality of hardware resources, a common resource, and an arbiter. The plurality of hardware resources are divided into groups of hardware resources and are coupled to the common resource and the arbiter. The arbiter controls which of the plurality of hardware resources has priority to access to the common resource. The arbiter includes a group shifting arbiter which shifts priority among the groups of hardware resources and a level shifting arbiter which separately shifts priority among the hardware resources within each of the groups. An error checking value generator system comprises a general purpose DMA controller and an arithmetic circuit. The arithmetic circuit is coupled to receive data from the general purpose DMA controller. The arithmetic circuit generates an error checking value based on the data received from the general purpose DMA controller and based on a polynomial equation. The arithmetic circuit is capable of being programmed with a plurality of different polynomial equations usable to generate error checking values of different types.

19 Claims, 8 Drawing Sheets

PROGRAMMABLE ERROR CHECKING VALUE CIRCUIT AND METHOD

BACKGROUND OF THE INVENTION

1. Field of the Invention

This invention relates to arbiter systems for controlling access to hardware resources in a computer system. This invention also relates to error checking systems that generate error checking values to detect errors in the transmission of data.

2. Description of Related Art

Computer systems use communication systems to communicate information between different hardware resources. An example of a communication system is a direct memory access (DMA) communication system used to transfer information between hardware resources without involvement of a microprocessor, thereby freeing the microprocessor to perform other tasks. Typically, in DMA communication systems, there are numerous hardware resources that take turns accessing a common data bus. This process is performed under the control of an arbiter which decides which resource has access based on the priority levels of the various resources. In general, arbiters are used any time there are multiple resources that share access to a common resource.

Different arbiters employ different schemes to control access to a common resource such as a data bus. Fixed priority schemes are schemes in which the priority level assigned to individual resources is fixed. Thus, if a first resource has a higher priority than a second resource, then the second resource is not granted access to the data bus whenever the first resource is requesting access. Fixed priority schemes allow resources that communicate more time-sensitive data to be given higher priority access to the data bus, and resources that communicate less time-sensitive data to be given lower priority access to the data bus. Shifting priority schemes are schemes in which the highest priority level shifts between resources. For example, a round robin priority scheme may be employed to ensure that each resource is granted access to the data bus. Shifting priority schemes avoid starving a particular resource from lack of access to the data bus. The number and type of resources utilized, the type of priority scheme utilized, and the priorities assigned to individual resources are typically design choices based on the application for which the computer system is utilized.

Computer systems are now often implemented using "system-on-chip" integrated circuits. In a single chip, these integrated circuits provide many of the functions that used to be spread among many integrated circuits. For example, in addition to the main microprocessor, it is not uncommon to have other circuits such as specialized serial interfaces, UARTs, memory controllers, DMA controllers, Ethernet interfaces, display interfaces, USB (universal serial bus) interfaces, and so on.

It is generally desirable for system-on-chip integrated circuits to be usable in a wide array of applications. To this end, manufacturers of such integrated circuits commonly provide such integrated circuits with numerous hardware resources, recognizing that a given application may only utilize a particular combination of the resources, leaving the remaining resources unutilized. This presents a challenge from the standpoint of providing a DMA arbitration scheme, because the application for which the integrated circuit will be utilized, as well as the particular combination of hardware resources utilized, is unknown. A DMA system that is not properly matched to the hardware resources used in a particular application results in data being communicated in a non-optimal manner and degrades overall performance of the system-on-chip integrated circuit. Therefore, there is a need for a highly flexible arbiter system to provide for a more optimal utilization of hardware resources (e.g., DMA resources) in such circumstances.

It is also common to employ error checking schemes in communication systems to ensure that any errors that occur during the transfer of data are detected. Examples of error checking schemes include CRC-16, CRC-16 Reverse, CRC-CCITT, CRC-CCITT Reverse, and CRC-32. Generally, error checking schemes operate by generating an error checking value as a function of the data that is transmitted. The bit length of the error checking value is typically short relative to the overall bit length of the transmitted data. Both parties to the transmission must generate the same value otherwise a transmission error has occurred. The error checking value can be generated using a microprocessor or using discrete logic circuitry such as a linear feedback shift register.

The type of error checking scheme that is employed in connection with a particular hardware resource is also application dependent. This, too, presents a challenge for the manufacturer of a system-on-chip integrated circuit. Given that a particular system-on-chip integrated circuit is liable to be employed in a wide array of applications, it is difficult to know in advance which hardware resources will be utilized, let alone which error checking schemes will be required for the hardware resources that are utilized. To address this problem, system-on-chip integrated circuits have typically relied on the microprocessor of the system-on-chip integrated circuit instead of discrete logic circuitry to generate error checking values. However, this approach places a significant burden the microprocessor and degrades the overall performance of the system-on-chip integrated circuit. Therefore, what is also needed is a flexible error checking value generator circuit, especially one that can be used with a general purpose DMA controller.

SUMMARY OF THE INVENTION

According to a first aspect of the invention, a system comprises a plurality of hardware resources, a common resource, and an arbiter. The plurality of hardware resources are divided into groups of hardware resources. The common resource is coupled to the plurality of hardware resources. The arbiter is coupled to the plurality of resources, and controls which of the plurality of hardware resources has priority to access to the common resource. The arbiter includes a group shifting arbiter and a level shifting arbiter. The group shifting arbiter shifts priority among the groups of hardware resources. The level shifting arbiter separately shifts priority among the hardware resources within each of the groups.

According to a second the invention, a system comprises a general purpose DMA controller and an arithmetic circuit. The arithmetic circuit is coupled to receive data from the general purpose DMA controller. The arithmetic circuit generates an error checking value based on the data received from the general purpose DMA controller and based on a polynomial equation. The arithmetic circuit is capable of being programmed with a plurality of different polynomial equations usable to generate error checking values of different types.

DETAILED DESCRIPTION OF THE INVENTION

1. Hardware Resources of System-On-Chip Integrated Circuit

Figure 1:
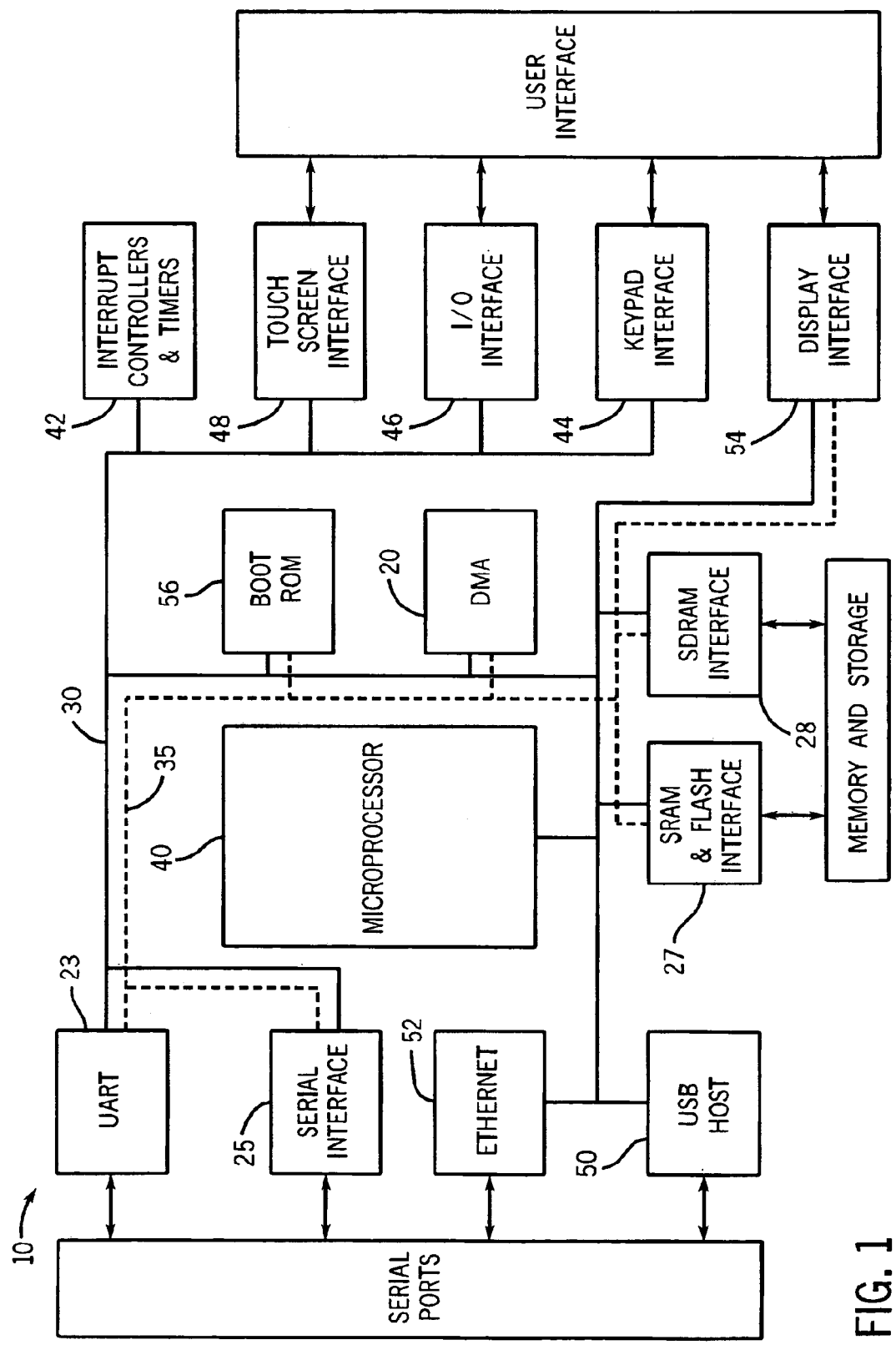
FIG. 1 is a system-on-chip integrated circuit that includes a DMA communication system.

Referring now to FIG. 1, FIG. 1 is a block diagram of an example of a system-on-chip integrated circuit 10 that includes a DMA communication system. The DMA communication system includes a DMA module 20 which is coupled to a plurality of hardware resources including one or more universal asynchronous receiver-transmitters (UARTs) 23, one or more serial interfaces 25 for interfacing to external devices (such as digital-to-analog converters (DACs), audio controllers, and so on), and one or more memory controllers 27 and 28. The DMA module is coupled to these devices by way of a data bus 30 and a DMA access request bus 35. In practice, the data bus 30 may include separate high speed bus and low speed busses. The resources 23, 25, 27, and 28 are connected to the data bus 30, and are accessible by the DMA modules.

In addition to the resources 23, 25, 27, and 28, there are a plurality of additional devices that are part of the integrated circuit 10 but that are not a source or destination resources for DMA transfers on the data bus 30. These devices include a microprocessor 40, interrupt controller/timers 42, a keypad interface 44, one or more I/O ports 46, a touch screen interface circuit 48, one or more universal serial bus (USB) host interfaces 50 for connection to USB devices such as a keyboard, mouse, printer, and so on, an Ethernet port 52, a display interface 54 (for example, a raster engine), and boot ROM 56 for storing program code executed during a boot-up sequence.

Likewise, in addition to the hardware resources 23, 25, 27, and 28, there ray be a plurality of additional hardware resources (not shown in FIG. 1) which are either a source or destination resources during a DMA transfer on the data bus 30 but which are not part of the system-on-chip integrated circuit 10. These resources are referred to as external hardware resources. A computer system that utilizes the system-on-chip integrated circuit 10 is unlikely to utilize all of the internal hardware resources and is likely to use some external resources. For example, assuming the system-on-chip integrated circuit 10 includes multiple UARTs and serial ports, only a portion of the UARTs and serial ports may be utilized, depending on how the system-on-chip integrated circuit 10 is configured.

Figure 2:
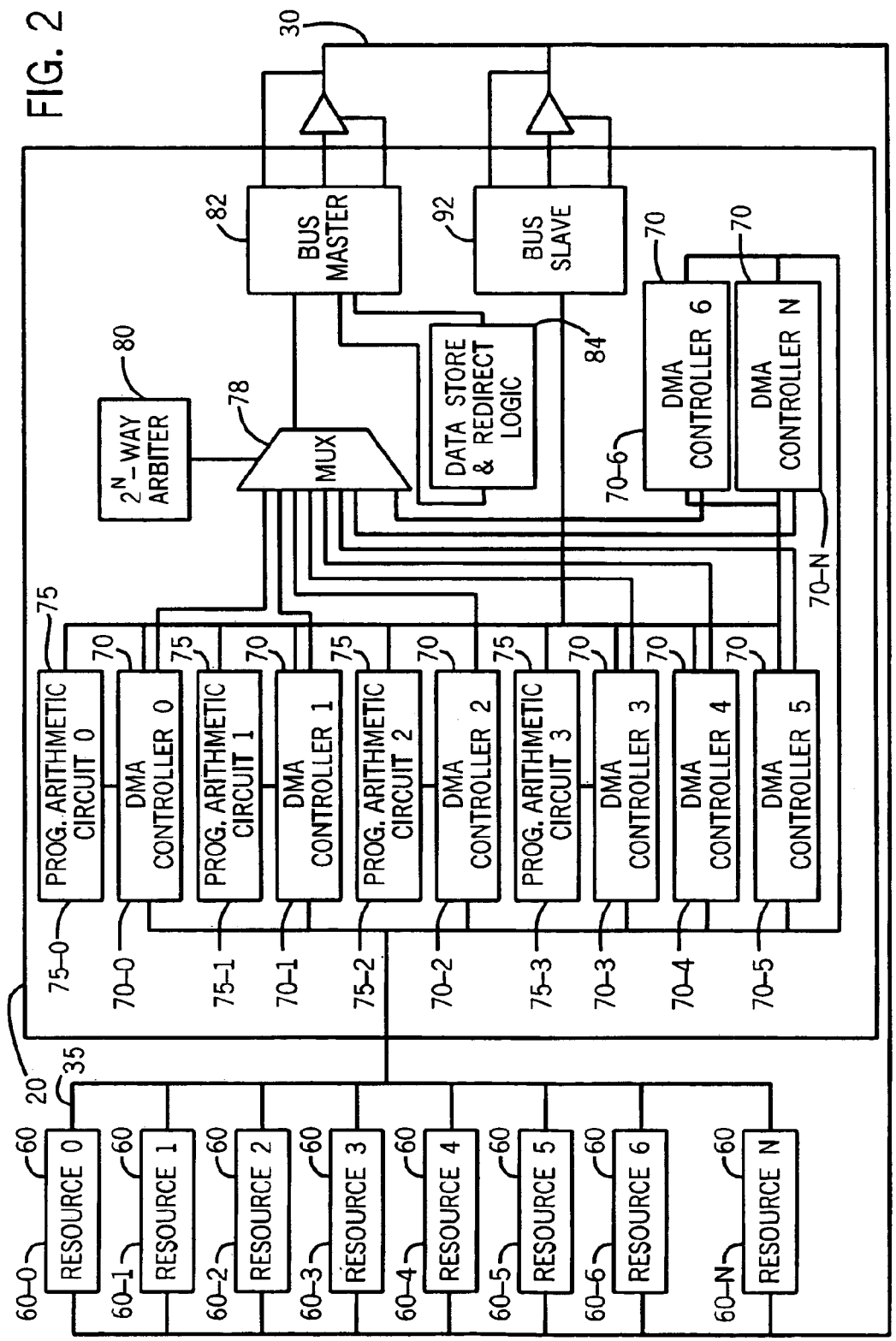
FIG. 2 is a block diagram of a DMA module of FIG. 1.

Referring now to FIG. 2, FIG. 2 is a block diagram showing the DMA module 20 of FIG. 1 in greater detail. In FIG. 2, the hardware resources have been renumbered to facilitate explanation of the DMA module 20, as will become clear below. The hardware resources (including the hardware resources 23, 25, 27, and 28 as well as any external hardware resources) are designated with the reference numerals 60-0 through 60-N. Herein, the reference numerals 60-0 through 60-N are used to refer to the hardware resources individually, and the reference numeral 60 is used to refer to the hardware resources collectively. (This scheme will be used in connection with other structures/reference numerals as well.) The hardware resources 60 may comprise a combination of some of the hardware resources 23, 25, 27, and 28 and a plurality of external hardware resources, although the particular combination is likely to vary depending on the application. The particular composition of the hardware resources is not important.

The access request bus 35 that couples the resources 60 to the DMA module 20 comprises one bit for each "active" resource 60, as well as additional bits for additional, unutilized ("inactive") hardware resources. In other words, the number of bits of the request bus 35 is equal to the total number of active and inactive resources. Thus, if the system-on-chip integrated circuit 10 comprises fourteen internal hardware resources that are capable of performing DMA transfers, and if the system-on-chip integrated circuit is further constructed to permit DMA transfers from two external hardware resources, then the access request bus 35 will be a 16-bit bus. If a particular hardware resource 60 is requesting access to perform a. DMA transfer, this is indicated by the state of the respective bit for that resource (e.g., high=access requested, low=access not requested).

The DMA module 20 includes a plurality of DMA controllers 70. (Again, to refer to the DMA controllers individually, the reference numerals 70-0 to 70-N are used.) In general, any resource 60 may be associated with any DMA controller 70. The DMA controllers 70 each include a register 72 that associates the particular controller 70 with a particular one of the hardware resources 60. For example, if there are sixteen total available hardware resources (including both active and inactive hardware resources), then the register is a four bit register allowing for sixteen different values. Any hardware resource 60 that is not associated with one of the controllers 70 is thereby rendered inactive.

Some of the DMA controllers 70 are coupled to error checking value generator circuits 75, the details of which are discussed below in connection with FIGS. 7–8. The error checking value generator circuits 75 can be dedicated to generate error checking values for a respective DMA controller 70 or can be initialized as a separate entity.

The DMA controllers 70 are each coupled to a multiplexer 78 which in turn is controlled by an arbiter 80. The DMA controllers 70 are coupled to the arbiter 80 by way of an M-bit access request bus 118 (shown in FIG. 4). When a particular hardware resource 60 requests access to the data bus 30, the access request is passed along by the associated DMA controller 70 to the arbiter 80. The arbiter 80 determines which DMA controller signals appear at the output of the multiplexer 78 by determining which DMA controller 70 has priority.

The output of the multiplexer 78 is provided to a bus master 82. The bus master 82 (operating as master) cooperates with two of the hardware resources 60 (operating as slaves) to perform a transfer on the data bus 30 in the following manner. When enabled, a DMA controller 70 makes an internal request to the arbiter 80. A request for access from any of the DMA controllers 70 causes the DMA module 20 to request access to the data bus 30. A separate arbiter is used to arbitrate priority between the DMA module 20 and other devices on the data bus 30 such as the microprocessor 26. The arbiter may be constructed if desired in the same manner as described herein in connection with the arbiter 80.

When multiple controllers 70 request access within the DMA module 20, the arbiter 80 decides which DMA controller 70 has priority. The selected DMA controller 70 transfers a source location address. During the read address transfer, the selected DMA controller 70 asserts an internal lock signal to the arbiter 80. The lock signal locks the DMA arbiter 80 so that during the next DMA cycle, the same selected DMA controller 70 can complete the transfer with a write cycle. The arbiter 80 is locked because all of the DMA controllers 70 share the same data storage register and data redirect logic 84. The data bus 30 communicates both data and address information. Upon completion of the read address transfer, the data read cycle executes, and the data is stored internally in the data store and redirect logic register 84 while the write address is transferred on the data bus 30. Depending on the data size, the data register 84 stores a single 32-bit word, duplicates a 16-bit half word in the upper and lower 16 bits, or duplicates a byte and stores 4 copies in the register 84. If necessary (depending on whether a bidirectional read/write data bus 30 is used), the bus master 82 inserts a bus idle cycle to avoid data contention. While transferring the write address during the data read cycle, the lock signal to the arbiter 80 is released. A terminal counter is triggered and the next read address is transferred on the data bus 30 at the same time as the data write cycle is performed. During the write cycle, all 32 bits are transferred onto the data bus 30 forming a single 32-bit word, two 16-bit half words, or four bytes. The hardware resource 70 receiving the transferred data then selects the appropriate address alignment for half word and byte transfers.

The DMA module 50 also includes a slave 92. The slave 92 operates in a slave/master relationship with another device operating as master on the data bus 30, such as the microprocessor 26. The presence of the slave 92 allows the master to manipulate the values stored in the registers of the DMA controller 70 and thereby control the configuration of the DMA controllers 70 with respect to the resources 60.

2. Arbiter Construction and Operation

Figure 3:
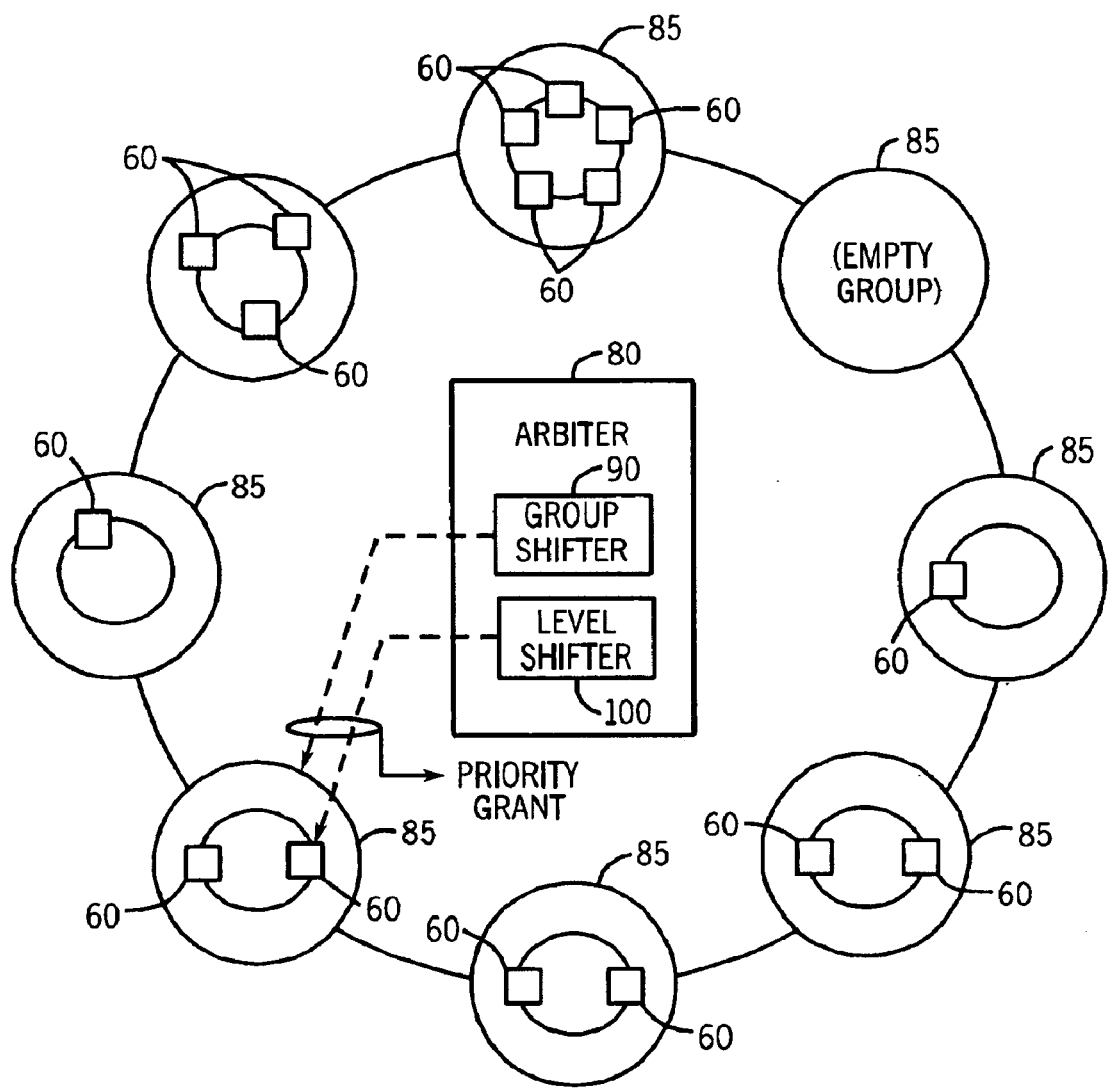
FIG. 3 is an overview of a preferred arbitration scheme used by the DMA module of FIG. 2.

Referring now to FIG. 3, FIG. 3 is an overview of the operation of the arbiter 80. As detailed below, the arbiter 80 preferably employs a two-tier shifting scheme to arbitrate priority between the hardware resources 60. The hardware resources 60 are organized into a plurality of groups 85. Some of the groups 85 comprise more than one hardware resource 60, some of the groups 85 comprise only a single hardware resource 60, and some of the groups 85 comprise no hardware resources 60. Preferably, as described below in conjunction with FIG. 5, the groups 85 are each formed of hardware resources 60 that are assigned to the same priority level. In the example of FIG. 3, the total number of hardware resources 60 is equal to sixteen and the number of groups 85 is eight. It will be appreciated that a larger or smaller number of hardware resources 60 and a larger or smaller number of groups 85 could be used.

The arbiter 80 comprises a group shifting arbiter 90 and a level shifting arbiter 100. The group shifting arbiter 90 shifts priority between the groups 85. The level shifting arbiter 100 shifts priority between hardware resources 60 within a group 85. Assuming the groups 85 are each formed of hardware resources 60 that are assigned to the same priority level, then the group shifting arbiter 90 operates to shift priority between groups of hardware resources 60 assigned to different priority levels, and the level shifting arbiter 100 operates to shift priority between hardware resources 60 assigned the same priority level. For a given hardware resource 60 to have priority, its group must have priority, and the hardware resource 60 must have priority within its group. In FIG. 3, a priority grant to a particular hardware resource 60 is shown as a grant to the group 85 in which the hardware resource 60 is located, as well as an individualized grant to the hardware resource 60 itself. As will be seen below, this two-level priority grant is in fact achieved with a single signal. In the illustrated embodiment, round robin priority shifting is performed, although other schemes could also be employed. Preferably, group shifting and level shifting are separately activated, allowing a variety of schemes including hybrid schemes to be employed (group shifting/level shifting, fixed groups/level shifting, group shifting/fixed levels, and fixed groups/fixed levels). With both the channel shifter and the level shifter off, the arbiter 80 implements a straight fixed priority system.

Therefore, when determining which hardware resource 60 has priority, the group shifting arbiter 90 determines which group 85 has priority. When group shifting is activated, priority is shifted to a new group 95 each new read/write cycle in which the DMA arbiter 80 itself is granted priority on the data bus 30 (by another arbiter). In FIG. 3, in which eight groups 85 have been defined, one of the groups 85 is granted priority, then another one of the groups 85 is granted priority, and so on, until all eight groups have had an opportunity to be granted priority (priority is not granted unless it is requested). When group shifting is not active, priority is not shifted and priority is granted based on the priority level of hardware resources with each group. Therefore, priority is not granted to a group 85 formed of lower priority hardware resources 60 unless there are no requests for access from groups 85 formed of higher priority hardware resources 60.

Additionally, the level shifting arbiter 100 determines which hardware resource 60 within a particular group 85 has priority. When level shifting is activated, priority is shifted to a new member of a group each time that group is given priority. In FIG. 3, for example, priority must circulate through all eight groups 85 five times before each hardware resource 60 within a group that has five members is given priority. When level shifting is not active, priority within the group is fixed where the lowest number controller is the highest priority member and is given priority whenever that group is given priority.

Figure 4:
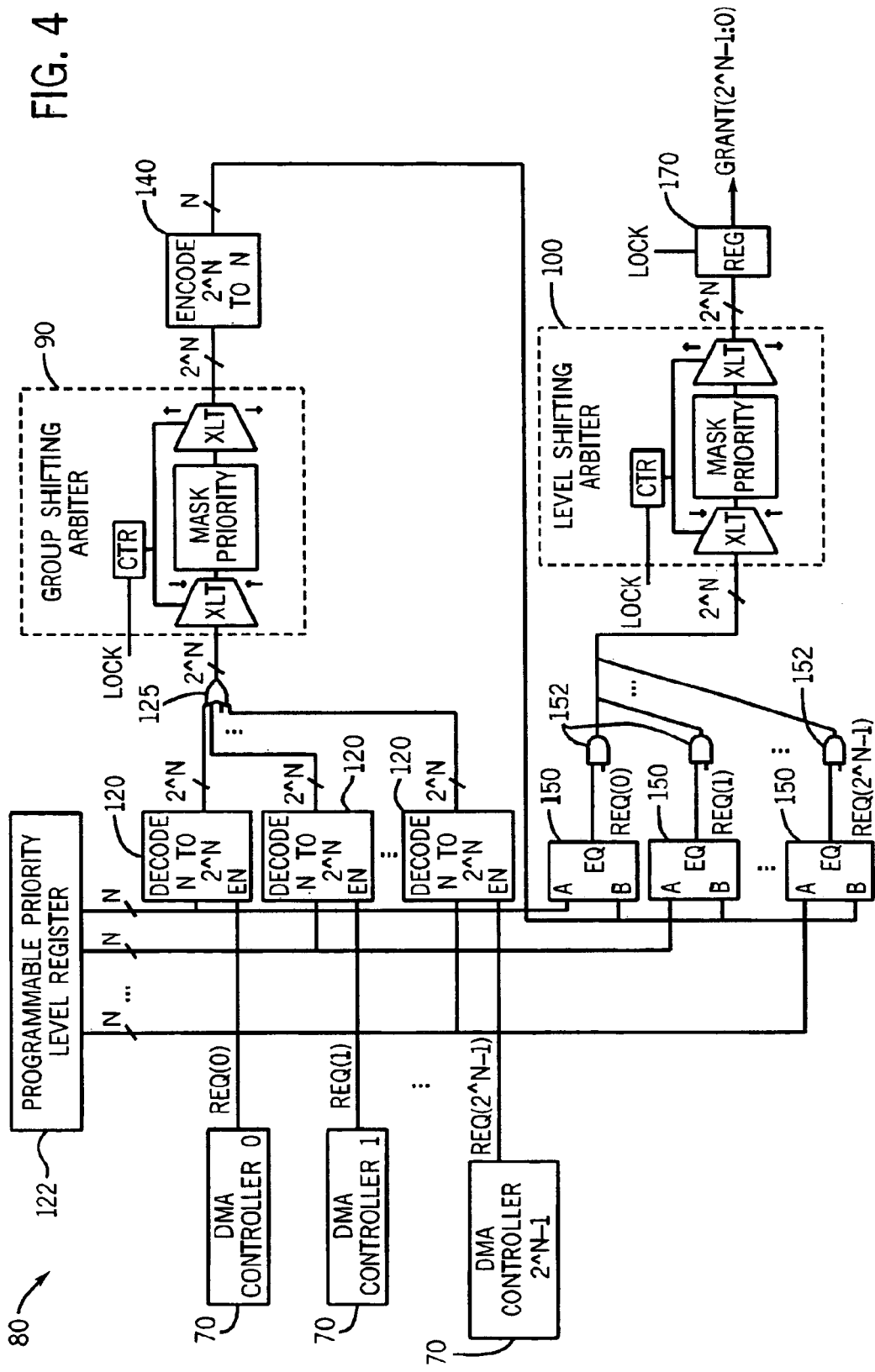
FIG. 4 is a block diagram of a preferred implementation of a DMA arbiter of the DMA module of FIG. 2.
Figure 5:
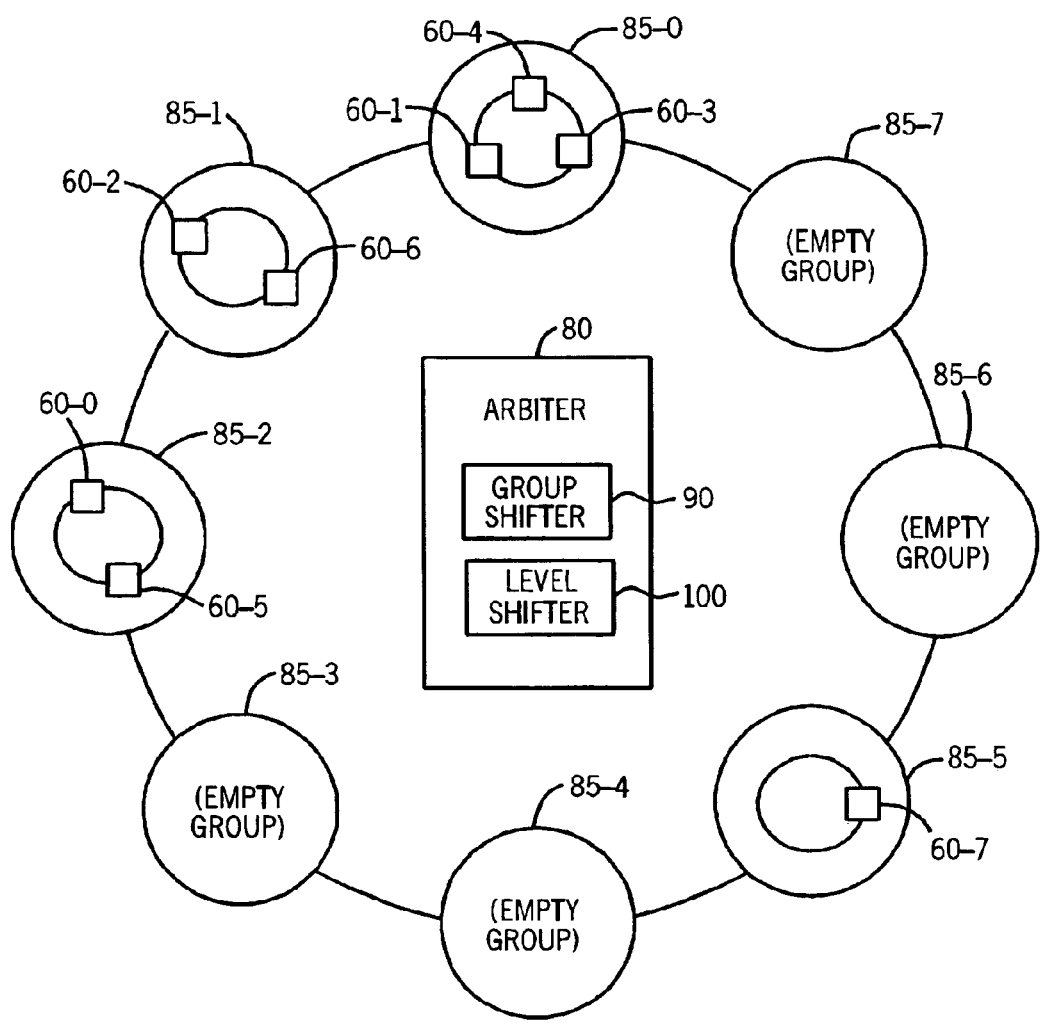
FIGS. 5–6 show the operation of the DMA arbiter of FIG. 4.
Figure 6:
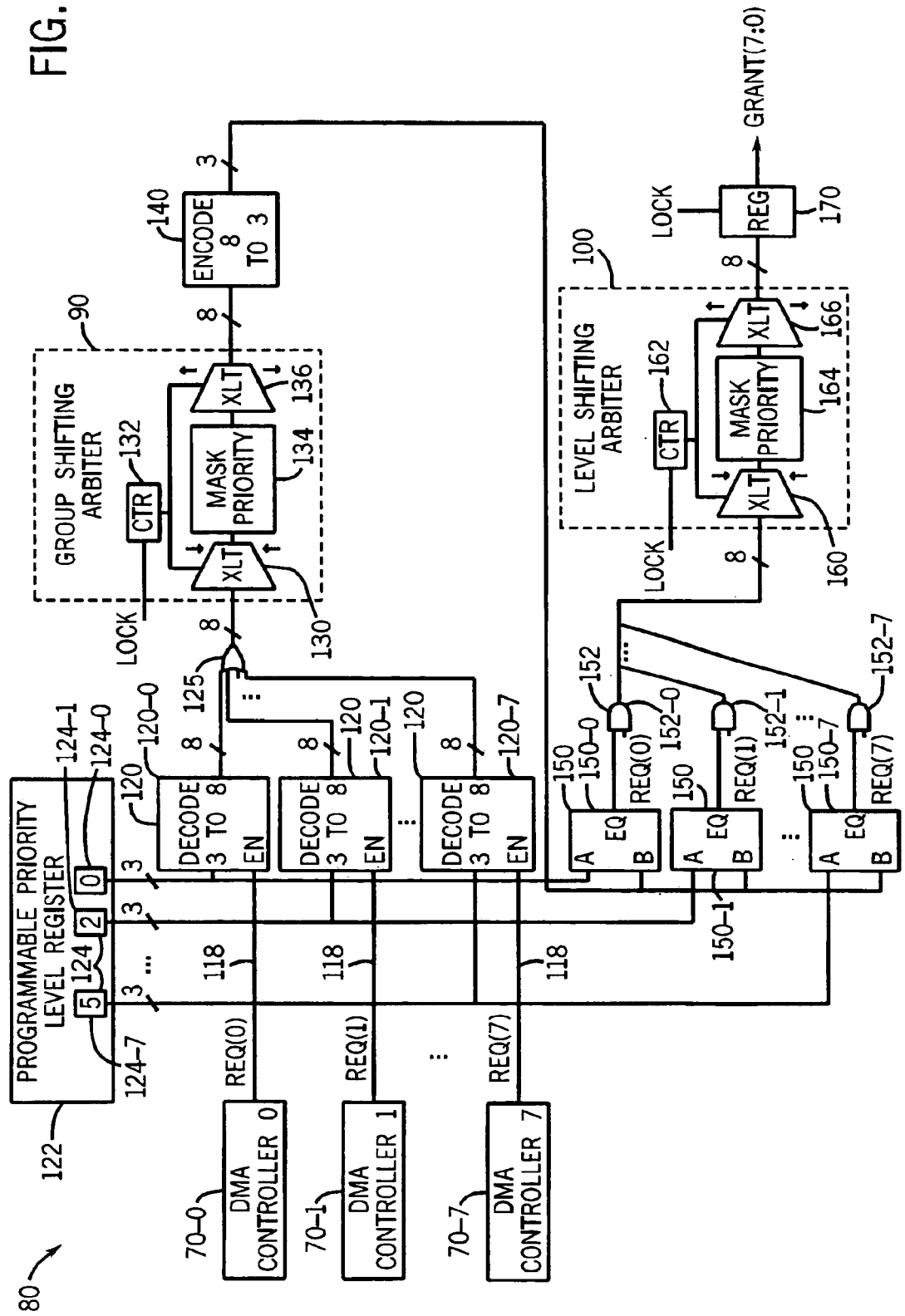

Referring now to FIGS. 4–6, FIG. 4 is a schematic diagram of a preferred implementation of the arbiter 80 of FIG. 2. The circuit components shown in FIG. 4 (e.g., decoders 120, encoder 140, comparators 150, AND gates 152, and the components of the group shifting arbiter 90 and the level shifting arbiter 100 are implemented using a hardware description language (HDL) such as verilog of VHDL (VHASIC (Very High Level ASIC) Hardware Description Language). In FIG. 4, the arbiter 80 is a $2^N$-way arbiter. For purposes of providing a clearer understanding of the construction and operation of the preferred arbiter 80, FIGS. 5–6 (discussed in greater detail below) provide a more specific example in which N has been set equal to three.

Referring first to FIG. 4, the DMA controllers 70 receive access requests from the hardware resources 60 (see FIG. 2). In response, the DMA controllers 70 pass these requests along to the arbiter 80 on an M-bit access request bus 118. The access requests are received by a plurality of N-to-$2^N$ decoders 120 that are respectively coupled to the DMA controllers 70. The plurality of decoders 120 also receive priority level information from a priority level register 122. If a given controller 70 is requesting access to the data bus 30, then the output of the corresponding decoder 120 is a $2^N$ bit number having all $2^N$ bit positions set equal to zero, except for the bit position that corresponds to the priority level of the corresponding DMA controller 70 requesting access to the data bus 30. The output of the plurality of decoders 120 is provided to an OR gate 125, which produces a $2^N$ bit number having all $2^N$ bit positions set equal to zero except for those positions corresponding to the priority levels of all DMA controllers 70 requesting access to the data bus 30. The output of the OR gate is provided to the group shifting arbiter 90. The output of the group shifting arbiter 90 is a $2^N$ bit number having all $2^N$ bit positions set equal to zero except for the bit position corresponding to the priority level of the group 85 to which priority has been granted. The output of the group shifting arbiter 90 is provided to a $2^N$-to-N encoder 140 that produces an N bit number that is equal to the priority level of the group 85 to which priority has been granted. The output of the encoder 140 is provided to a plurality of comparator circuits 150. The plurality of comparator circuits 150 compare the N bit number from the encoder 140 to the priority level information from the register 122, and the output of the comparators 150 is provided to AND gates 152. The outputs of the AND gates 152 are combined to form a $2^N$ bit number having all $2^N$ bit positions set equal to zero except for those positions corresponding to the DMA controllers 70 that have issued an access request and that belong to the group 85 to which priority has been granted. The output of the AND gate 152 is provided to the level shifting arbiter 100. The output of the level shifting arbiter 100 is a $2^N$ bit number having all $2^N$ bit positions set equal to zero, except for the bit position that corresponds to the DMA controller 70 that has been granted access to the data bus 30. The output of the level shifting arbiter 100 is provided to a register 170, which locks the priority grant while the DMA transfer is being performed.

Referring now to FIGS. 5–6, a more specific example is provided. FIG. 5 is similar to FIG. 3 except that a different set of groups have been formed from eight hardware resources. For the example of FIGS. 5–6, it is assumed that the total number of active hardware resources is equal to eight (N=3, $2^N$=8). Referring first to FIG. 5, the hardware resources 60-1, 60-3 and 60-4 have been assigned a priority level equal to zero, and therefore are in the same group 85-0. The hardware resources 60-2 and 60-6 have been assigned a priority level equal to one, and therefore are in the same group 85-1. The hardware resources 60-0 and 60-5 have been assigned a priority level equal to two, and therefore are in the same group 85-2. The hardware resource 60-7 has been assigned a priority level equal to five, and therefore is in the group 85-5. No devices have been assigned priority levels of three, four, six or seven and, therefore, the groups 85-3, 85-4, 85-6 and 85-7 are empty.

Referring now to FIG. 6, the operation of the arbiter 80 of FIG. 4 is described in connection with the priority level assignments of FIG. 5. For simplicity, it is assumed that the hardware resource 60-0 is controlled by the DMA controller 70-0, that the hardware resource 60-1 is controlled by the DMA controller 70-1 and so on. As a result of this assumption, the DMA controllers 70 in FIG. 6 have the same priority levels as the hardware resources 60 in FIG. 5. As previously noted, however, each of the DMA controllers 70 is capable of being connected to any of the hardware resources 60.

The DMA controllers 70 receive access requests from the hardware resources 60 (see FIG. 2). In response, the DMA controllers 70 pass these requests along to the arbiter 80 on an M-bit access request bus 118. With eight hardware resources, the M-bit access request bus 118 is an 8-bit bus. Further, for example, if the DMA controllers 70-1, 70-2, 70-6 and 70-7 are asserting access requests and the remaining DMA controllers 70-0, 70-3, 704 and 70-5 are not asserting access requests, then the following binary number transmitted on the access bus 118: 11000110.

The requests are received at the enable input of the decoders 120. With eight hardware resources 160, there are eight decoders 120 and the decoders 120 are 3-to-8 decoders. The decoders 120 also receive priority level information from the priority level register 122. With eight hardware resources, the signal received by each of the decoders 120 from subregisters 124 of the programmable priority level register 122 is a 3-bit signal. The registers 124 are configured during setup and indicate the priority level of a respective DMA controller 70. For example, because the DMA controller 70-7 has been assigned a priority level equal to five, the decoder 120-7 receives the binary number 101 (i.e., which is equal to five in hexadecimal) from the register 124-7.

If a given controller 70 is requesting access to the data bus 30, then the respective decoder 120 is enabled and performs a 3-to-8 conversion of the priority level input from the register 124. The output of the respective decoder 120 is an 8-bit number having all eight bit positions set equal to zero, except for the bit position that corresponds to the priority level of the DMA controller 70 requesting access to the data bus 30. For example, if the DMA controllers 70-1, 70-2, 70-6 and 70-7 are asserting access requests and the remaining DMA controllers 70-0, 70-3, 704 and 70-5 are not asserting access requests, then the following binary values are output by the decoders 120.

| Decoder | Output |
| --- | --- |
| 120-0 (Access request not asserted) | 0000 0000 |
| 120-1 (Priority = 0) | 0000 0001 |
| 120-2 (Priority = 1) | 0000 0010 |
| 120-3 (Access request not asserted) | 0000 0000 |
| 120-4 (Access request not asserted) | 0000 0000 |
| 120-5 (Access request not asserted) | 0000 0000 |
| 120-6 (Priority = 1) | 0000 0010 |
| 120-7 (Priority = 5) | 0010 0000 |

The output of the decoders 120 is provided to an OR gate 125 which performs a logical OR operation on the eight 8-bit signals received at its input. The output of the OR gate 125 is an eight bit number having all eight bit positions set equal to zero, except for those positions corresponding to the priority levels of any DMA controllers 70 requesting access to the data bus 30. For example, if the OR gate 125 receives the eight 8-bit signals in the table above, the output of the OR gate 125 is 0010 0011. It may be noted that only three bits are set equal to one, even though four DMA controllers 70 are asserting access requests, because two of the DMA controllers 70 are assigned to the same priority level.

The output of the OR gate 125 is provided to the group shifting arbiter 90. The group shifting arbiter 90 includes a translator 130 which receives the 8-bit signal from the OR gate 125. The translator 130 is controlled by a counter 130 that in turn is controlled by the lock signal discussed above in connection with FIG. 2. When the counter 132 counts, and assuming the lock signal is off, the translator 130 translates the output of the OR gate 125. This is shown in the following table.

| Count | Output of Translator 130 |
|---|---|
| 0 | 0010 0011 |
| 1 | 1001 0001 |
| 2 | 1100 1000 |
| 3 | 0110 0100 |
| 4 | 0011 0010 |
| 5 | 0001 1001 |
| 6 | 1000 1100 |
| 7 | 0100 0110 |

The counter will count whenever the LOCK signal is not asserted. This continuous incrementing of the translator is the mechanism for shifting the group priority. The translator 130 translates the binary number from the OR gate 125 based on the counter value. For example, if the counter were two, the output of the translator 130 would 1100 1000 as shown in the table above. The mask circuit 134 passes the lowest active bit position and masks any remaining bit positions that are equal to one. This results in a value of 0000 1000 going into the second translator 136. The translator 136 performs the inverse operation as the translator 130. As a result, the output of the translator 136 is an 8-bit binary number having one bit set to one and the remaining seven bits set to zero. The bit that is set to one has a bit position that corresponds to the priority level of the group 85 to which priority has been granted. For example, if priority has been granted to group 85-5, then the output of the translator 136 is 00100000.

If the lock signal is on, then the group shifting arbiter 90 will not change the determined priority. In this event, the counter 132 will not increment, so the translations and mask logic will continue to provide the same priority values.

The output of the group shifting arbiter 90 is provided to the 8-to-3 encoder 140. The encoder 140 produces a 3-bit number that is equal to the priority level of the group 85 to which priority has been granted. For example, if priority has been granted to group 85-5, then the input to the encoder 140 is 0010000 (i.e., a binary number with the fifth bit set to one), then the output of the encoder 140 is 101 (i.e., binary five).

The output of the encoder 140 is provided to the comparator circuits 150. The comparator circuits 150 compare the 3-bit number from the encoder 140 to the 3-bit priority level value from the registers 124. For example, if the group shifting arbiter 90 grants priority to group 85-1, then the output of the encoder 140 is the binary number 001 (i.e., binary one), and the comparators 150 operate to determine whether any of the DMA controllers 70 have priority equal to one. In the example above, where DMA controllers 70-2 and 70-6 have priority equal to one, the outputs of the comparators 150-2 and 150-6 (not shown) are equal to one, and the outputs of the remaining comparators are equal to zero.

The output of the comparators 150 are provided to the AND gates 152. The AND gates 152 also receive the access requests from the DMA controllers 70. Therefore, the output of the AND gates 152 will only be a logical one if (1) the priority level assigned to the corresponding DMA controller 70 is equal to the priority level for the group 85 to which priority has been granted, and (2) the corresponding DMA controller 70 is asserting a request for priority. For example, if the group shifting arbiter 90 grants priority to group 85-1, and the DMA controllers 70-2 and 70-6 are both asserting an access request, then the AND gates 152-2 and 156-6 output a one, and the remaining AND gates 152 output a zero. If, instead, the DMA controller 70-2 is not asserting an access request, then the only AND gate that outputs a one is the AND gate 152-6.

The output of the AND gates 152 are combined to form an 8-bit number having all eight bit positions set equal to zero except for those positions corresponding to the DMA controllers 70 that have issued an access request and that belong to the group 85 to which priority has been granted. For example, if priority has been granted to group 85-1, and the DMA controllers 70-2 and 70-6 are both asserting an access request, then the outputs of the AND gates 152 are combined to form the binary number 01000100.

The combined output of the AND gates 152 is provided to the level shifting arbiter 100. The level shifting arbiter 100 comprises a translator 160, a counter 162, a mask priority block 164, and a translator 166 which operate in generally the same fashion as the translator 130, the counter 132, the mask priority block 134, and the translator 136 of the group shifting arbiter 90.

The output of the level shifting arbiter 100 is an 8-bit number having all eight bit positions set equal to zero, except for the bit position that corresponds to the DMA controller 70 to which priority has been granted. The output of the level shifting arbiter 100 is provided to a register 170. The register 170 receives the lock signal, which is on while a DMA transfer is being performed. As a result, the priority grant is locked while the DMA transfer is being performed, thereby preventing the priority grant from changing in the middle of a DMA transfer. The lock signal remains on for one DMA cycle, during which one word is transmitted. (In the disclosed arrangement, the hardware resources 60 take turns transmitting words during DMA read/write cycles. It should be noted, however, that the arbiter 80 could also be used with burst DMA controllers.)

Referring back to FIG. 5, it may be recalled that not assigning any hardware resources 60 to a particular priority level causes the group 85 for that priority level to be an empty group. In FIG. 5, the groups 85-3, 854, 85-6 and 85-7 are empty groups because none of the hardware resources 60 are assigned a priority level of three, four, six or seven. This results in certain groups being statistically favored to receive a priority grant. For example, once the group 85-2 is granted priority during one DMA cycle in the round-robin priority scheme, the group 85-3 is scheduled to have priority for the next DMA cycle. However, because the group 85-3 is an empty group, the group shifting arbiter 90 will grant priority to the group 85-5 (assuming the group 85-5 is asserting an access request). This results because of the mask priority step 134. Likewise, on the next DMA cycle, instead of granting priority to the empty group 854, priority is again granted to the group 85-5. Priority is also granted to the group 85-5 the next DMA cycle as well. Thus, the priority opportunity is provided to another one of the groups 85 rather than being eliminated altogether. This, in combination with the ability to assign multiple hardware resources 60 to the same priority level, allows for flexibility in weighting the likelihood that certain groups 85 are granted priority.

3. Error Checking Value Generator Construction and Operation

Referring again to FIGS. 1–2, as previously described, the system-on-chip integrated circuit 10 comprises a plurality of hardware resources 60 and a plurality of DMA controllers 70. The configuration of the DMA controllers 70 relative to the hardware resources 60 is preferably programmable, such that any DMA controller 70 can be programmed to control DMA transfers performed by any of the hardware resources 60. Thus, any given DMA controller 70 may be called upon to control a variety of different possible types of DMA transfers, depending on the hardware resource 60 to which the DMA controller 70 is programmably coupled.

For this reason, the DMA controllers 70 are considered general purpose DMA controllers.

Some of the DMA controllers 70 (specifically, the DMA controllers 70-0, 70-1, 70-2 and 70-3) are coupled to a respective error checking value generator circuit 75. The purpose of the error checking value generator circuit 75 is to produce an error checking value using a mathematical operation that accepts transmitted data as input. The error checking value is then transmitted with the data (usually being added to the end of the transmitted data stream). When the data is received, a second mathematical operation (which is generally the same as the first mathematical operation) is performed to verify the error checking value and thereby the correctness of the received data.

The error checking value generator circuits 75 are preferably programmable. As a result, each of the error checking value generator circuits 75 is capable of generating a variety of different types of error checking values (including, for example, CRC-16, CRC-16 Reverse, CRC-CCITT, CRC-CCITT Reverse, and CRC-32 values). Therefore, the error checking value generator circuits 75 are general purpose circuits that are particularly well suited for use with the general purpose DMA controllers 70. However, if desired, the programmable error checking value generator circuits 75 may also be made usable in connection with another bus master on the data bus 30.

Figure 7:
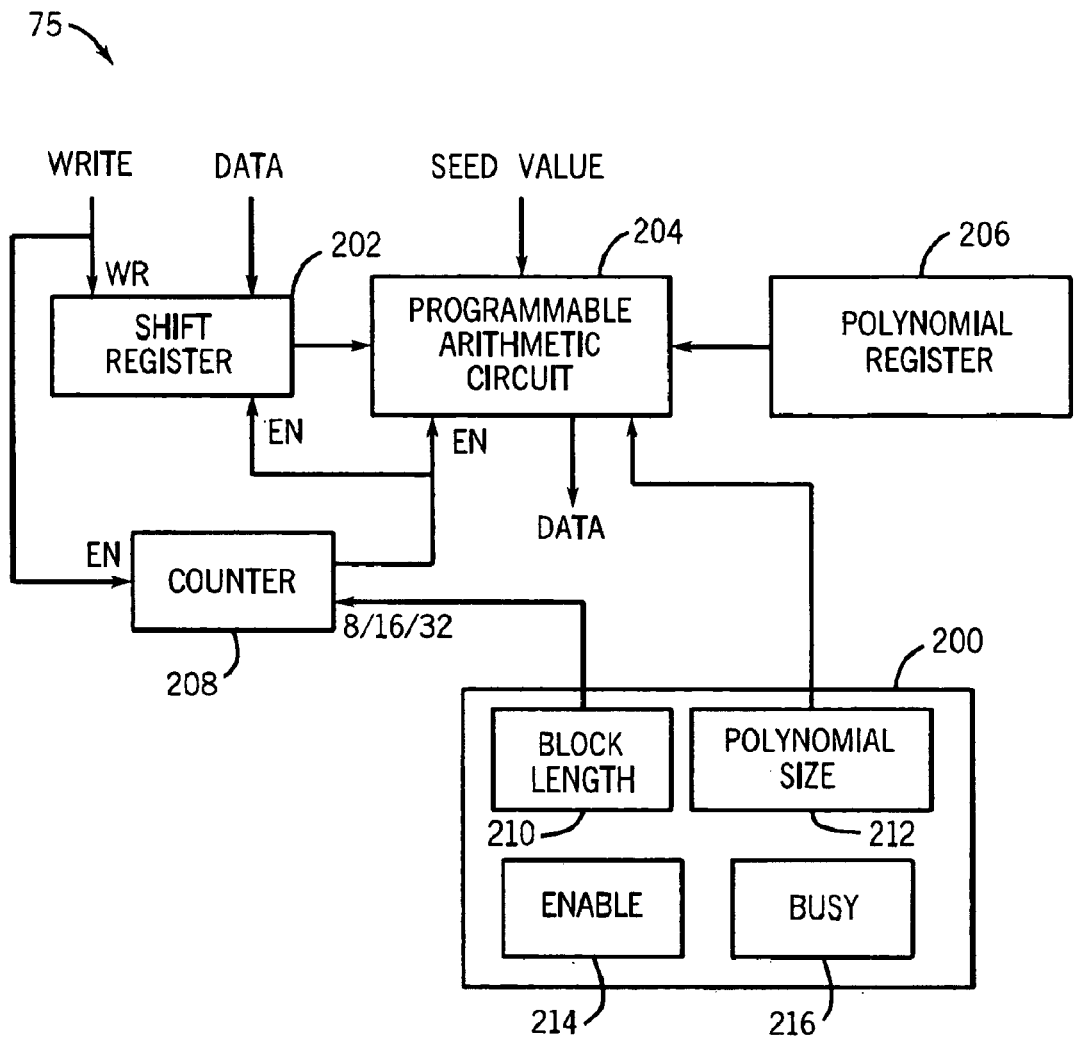
FIG. 7 is a block diagram of a programmable error checking value generator circuit of the DMA module of FIG. 2.

Referring now to FIG. 7, an exemplary one of the error checking value generator circuits 75 is shown in greater detail. The error checking value generator circuit 75 comprises a configuration register 200, a shift register 202, a programmable polynomial arithmetic circuit 204, a polynomial divisor register 206, and a counter 208. As described in greater detail below in connection with FIG. 8, the polynomial arithmetic circuit 204 is preferably implemented using a linear feedback shift register. Again, the components of the circuit 75 are implemented using a hardware description language (HDL) such as verilog of VHDL (VHASIC (Very High Level ASIC) Hardware Description Language).

The programmability of the error checking value generator circuit 75 is provided in part by the configuration register 200, which further comprises subregisters 210–214. The register 210 is a 2-bit register that indicates the data stream length (8 bits, 16 bits, or 32 bits) of the transmitted data and therefore the shift mode utilized by the shift register 202. The register 212 is a 1-bit register that indicates whether the polynomial arithmetic circuit 204 is to employ 16-bit polynomial math or 32-bit polynomial math. The register 214 is a 1-bit register that indicates whether the value generator circuit 75 is enabled. An additional register 216 is also provided which is used during operation to provide a hardwired busy indication to the DMA controller 75 to indicate the busy/ready status of the error checking value generator circuit 75. In addition to the configuration register 200, programmability of the error checking value generator circuit 75 is also provided by way of the polynomial register 206, which stores information describing a polynomial that is used by the programmable arithmetic circuit 204 to generate an error checking value, as described below.

After appropriate values are stored in the registers 206, 210, and 212, the arithmetic circuit 204 is initialized by writing a seed value to the arithmetic circuit. The seed value is an initial value stored in the arithmetic circuit 204, the purpose of which is to cause the arithmetic circuit 204 to produce a non-zero output value in response to a given block of input data even if the input data for the block is all zeroes. As detailed below, the output of the arithmetic circuit 204 is preferably acquired from a register that receives values from D flip flops of a linear feedback shift register. In this case, the same register may be used to write a seed value to the arithmetic circuit 204.

To generate an error checking value, the corresponding DMA controller 70 transmits a write enable signal WR to the shift register 202 along with the data to be transmitted. When the write enable signal WR is received, this allows the transmitted data to be written in the shift register 202. The transmitted data is written in the shift register 202 in 8-bit, 16-bit or 32-bit blocks.

The write enable signal WR is also provided to an enable input of the counter 208. The counter 208 also receives the configuration information from the register 210 indicating whether 8-bit, 16 bit, or 32-bit blocks are being transmitted. When the counter 208 receives the write enable signal WR, the counter 208 begins counting to 8, 16, or 32, depending on the information received from the register 210.

The output of the counter is provided as an enable signal to the shift register 202 and the arithmetic circuit 204. As the counter 208 counts to 8, 16, or 32, the shift register 202 shifts the data into the arithmetic circuit 204.

When using the error checking value generating circuits independently in 32-bit or 16-bit shift modes (for example, with a software controlled check algorithm), the data stream length must be word or halfword multiples of bytes respectively. If the data stream length is not a multiple of words when using 32-bit shift mode or is not a multiple of half words when using 16-bit shift mode, 32-bit or 16-bit shift mode may be used to speed transfers for all of the data 16 bit half word data or 8-bit byte data except for the remainder byte(s). The arithmetic circuit 204 can then be switched to 8-bit mode to finish shifting the remaining byte(s).

After data has been written to the shift register 202, a period of time elapses (e.g., 9, 17, or 33 bus clocks for the 8-bit, 16-bit, or 32-bit modes, respectively) after which time additional data is transferred to the shift register 202 or the checking value is obtained. A hardware busy signal is provided to the respective DMA controller 70 to prevent the DMA controller 70 from attempting to transmit new data during this time. For software controlled algorithms, the microprocessor 26 may read the busy status bit in the register 216. After transferring all data values through the arithmetic circuit 204, the output of the arithmetic circuit 204 may be read to obtain the final error checking value.

Figure 8:
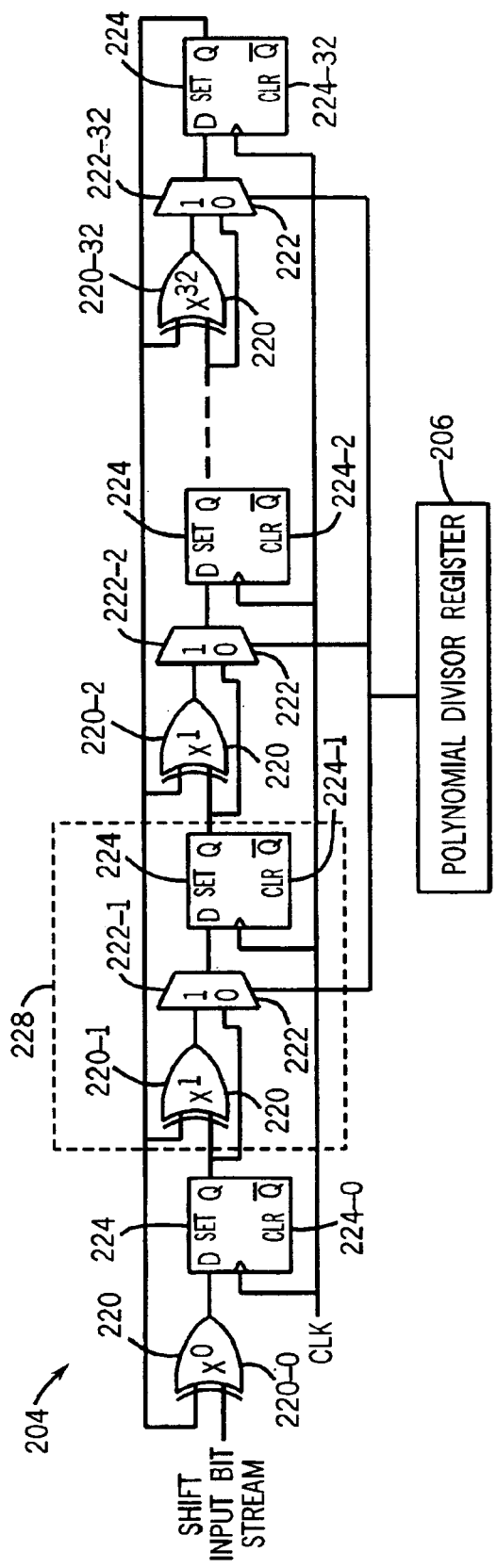
FIG. 8 is a schematic diagram of a programmable linear feedback shift register circuit of FIG. 6.

Referring now to FIG. 8, the arithmetic circuit 204 is shown in greater detail. In the preferred embodiment, the arithmetic circuit 204 is implemented using a programmable linear feedback shift register 218. The linear feedback shift register 218 further comprises a plurality of XOR gates 220, a plurality of multiplexers 222, and a plurality of D flip flops 224. Assuming the arithmetic circuit 204 is to be used for performing 32-bit polynomial math, then thirty-two XOR gates 220, multiplexers 222, and D flip flops 224 may be used. As will become apparent, fewer or more XOR gates 220, multiplexers 222, and D flip flops 224 could be used, depending on the polynomial operations to be performed.

Error checking schemes such as CRC-16, CRC-16 Reverse, CRC-CCITT, CRC-CCITT Reverse, and CRC-32 operate in the following manner. Any input data stream of length k can be represented as a dividend polynomial d(x)

with degree k-1. To generate an error checking value, the dividend polynomial d(x) is divided by a divisor polynomial p(x), and the remainder s(x) is the signature or error checking value for the polynomial:

$$d(x)/p(x)=q(x)+s(x)/p(x) \quad d(x)=q(x)p(x)+s(x)$$

The linear feedback shift register 218 can be configured to perform a division (or multiplication) of this type for a variety of error checking schemes including common error checking schemes such as CRC-16, CRC-16 Reverse, CRC-CCITT, CRC-CCITT Reverse, and CRC-32. The polynomial divisors used by these schemes are as follows: CRC-16 ($x^{16}+x^{15}+x^2+1$), CRC-16 Reverse ($x^{16}+x^{14}+x+1$), CRC-CCITT (SDLC, X.25, XMODEM) ($x^{16}+x^{12}+x^5+1$), CRC-CCITT Reverse ($x^{16}+X^{11}+x^4+1$), and CRC-32 ($x^{32}+x^{26}+x^{23}+x^{22}+x^{16}+x^{12}+x^{11}+x^{10}+x^8+x^7+x^5+x^4+x^2+x+1$).

The base polynomial of a linear feedback shift register 218 is configured by the connection of the feedback XOR gates 220. The presence/absence of an XOR gate at a particular bit position determines whether the polynomial contains an $x^n$ for that bit position. For example, if the multiplexer 222-1 passes the input from the XOR gate 220-1 to the D flip flop 224-1, then the divisor polynomial contains an $x^1$ term. If instead the multiplexer 222-31 passes the input from the D flip flop 224-0 to the D flip flow 224-1, then the divisor polynomial does not contain an $x^1$ term. Thus, the feedback points determine the divisor polynomial.

Thus, a plurality of building blocks 228 are formed each of comprises an XOR gate 220, a multiplexer 222 and the D flip flop 224 (although no multiplexer is used for the first building block, since all common polynomials comprise an $X^0$ or 1 term). By combining thirty-two of the building blocks 228 in series, a circuit that performs polynomial division with a polynomial division up to $X^{32}$ is constructed. The particular terms that form the polynomial are then determined based on the operation of the multiplexers 222, which in turn is determined by the manner in divisor polynomial register 206 is programmed. The divisor polynomial register 206 comprises a series of bits, with each bit being provided as a control input to a respective one of the multiplexers 222.

In operation, the linear feedback shift register 218 receives the serial data transmitted by the shift register 202. When the stream of data is shifted into the linear feedback shift register 218, the stream represents the coefficients of the dividend polynomial p(x). The dividend polynomial d(x) is shifted in highest degree coefficient first. Polynomial division is performed as the data shifts through the shift register 218 (or multiplication may be performed, depending on the shift direction). The remainder s(x) of this division operation is the final contents of the D flip flops 224. The quotient polynomial q(x) is shifted out of the register 218 and is discarded.

The error checking value that is ultimately used is typically the result of numerous (e.g., 256, 512, 1024 or more) blocks of data that have been transferred from the shift register 202 to the arithmetic circuit 204. Once these blocks have been transferred through the arithmetic circuit 204, the error checking value is obtained from the outputs of the D flip flops 224 and is transmitted along with the transmitted data stream (i.e., the data provided to the shift register 202) to a bus slave on the data bus 30.

Many other changes and modifications may be made to the present invention without departing from the spirit thereof. The scope of these and other changes will become apparent from the appended claims.

What is claimed is:

1. A system comprising:
   (A) a general purpose DMA controller;
   (B) a linear feedback shift register, the linear feedback shift register being coupled to receive data from the general purpose DMA controller, the linear feedback shift register comprising a plurality of programmable polynomial building blocks, the plurality of programable polynomial building blocks being connected in a sequence with ach building block corresponding to a respective exponential term in a polynomial of a polynomial equation implemented by the linear feedback shift register, each building block comprising
      (1) a feedback gate, the feedback gate being coupled to an output of an adjacent polynomial building block in the sequence and to a non-adjacent polynomial building block in the sequence,
      (2) a multiplexer, the multiplexer being coupled to an output of the feedback gate and to the output of the adjacent polynomial building block in the sequence, the multiplexer determining whether the flip flop receives an input from an output of the feedback gate or from the output of the adjacent polynomial building block,
      (3) a flip flop, the flip flop having an input coupled to an output of the multiplexer, and
   wherein, when the flip flop receives an input from the output of the feedback gate, the respective exponential term is included in die polynomial,
   wherein, when the flip flop receives an input from the immediately-preceding flip flop, the respective exponential term is not included in the polynomial, and
   wherein the multiplexers of each of the programmable polynomial building blocks are programmable to determine which of the exponential terms are included in the polynomial of the polynomial equation.

2. A system according to claim 1, wherein the linear feedback shift register performs polynomial division, and wherein the polynomial is a polynomial divisor.

3. A system according to claim 1, wherein the system further comprises a polynomial register comprising a plurality of bits, each bit determining whether a particular exponential term is present in the polynomial of the polynomial equation.

4. A system according to claim 1, wherein the system further comprises a programmable shift register, the programmable shift register being programmable to shift different block sizes of data into the linear feedback shift register.

5. A system according to claim 1, wherein the general purpose DMA controller is capable of controlling DMA communication of data from a universal asynchronous transmitter-receiver, a memory controller, and a serial port interface.

6. A circuit according to claim 1, wherein the feedback gate is an XOR gate.

7. A system according to claim 1, wherein the linear feedback shift register is capable of being programmed with a divisor polynomial having the following form: $x^{16}+x^{15}+x^2+1$.

8. A system according to claim 1, wherein the linear feedback shift register is capable of being programmed with a divisor polynomial having the following form: $x^{16}+x^{12}+x^5+1$.

9. A system according to claim 1, wherein the linear feedback shift register is capable of being programmed with a divisor polynomial having the following form: $x^{16}+x^{11}+x^4+1$.

10. A system according to claim 1, wherein the linear feedback shift register is capable of being programmed with a divisor polynomial having the following form: $x^{32}+x^{26}+x^{23}x^{22}+x^{16}+x^{12}+x^{11}+x^{10}+x^8+x^7+x^5+x^4+x^2+x+1$.

11. A system according to claim 1, wherein the linear feedback shift register is capable of being programmed with divisor polynomials having each of the following forms: $x^{16}+x^{15}+x^2+1$; $x^{16}+x^{14}+x+1$; $x^{16}+x^{12}+x^5+1$; $x^{16}+x^{11}+X^4+1$; and $x^{32}+x^{26}+x^{23}x^{22}+x^{16}+x^{12}+x^{11}+x^{10}+x^8+x^7+x^5+x^4+x^2+x+1$.

12. A system comprising:

a plurality of different types of hardware resources;

a plurality of general purpose DMA controllers, the plurality of general purpose DMA controllers being coupled to respective ones of the plurality of hardware resources, the coupling of the general purpose DMA controllers to the plurality of hardware resources being programmable, such that each of the general purpose DMA controllers may be programmably coupled to different ones of the plurality of different hardware resources, the plurality of general purpose DMA controllers each being configured to control a plurality of different types of DMA transfers between a plurality of different combinations of the plurality of different types of hardware resources;

a plurality of arithmetic circuits, the plurality of arithmetic circuits being coupled to respective ones of the plurality of general purpose DMA controllers, each of the plurality of arithmetic circuits being coupled to receive data from the respective general purpose DMA controller, and each of the plurality of the arithmetic circuits generating an error checking value based on the data received from the respective general purpose DMA controller and based on a polynomial equation; and wherein each of the plurality of arithmetic circuits is capable of being programmed with a plurality of different polynomial equations usable to generate error checking values of different types.

13. A system according to claim 12, wherein each of the plurality of arithmetic circuits is capable of being programmed with divisor polynomials having each of the following forms: $x^{16}+x^{15}+x^2+1$; $x^{16}+x^{14}+x+1$; $x^{16}+x^{12}+x^5+1$; $x^{16}+x^{11}+x^4+1$; and $x^{32}+x^{26}+x^{23}x^{22}+x^{16}+x^{12}+x^{11}+x^{10}+x^8+x^7+x^5+x^4+x^2+x+1$.

14. The system of claim 12, the arithmetic circuit performs polynomial division and wherein the divisor polynomial is programmable.

15. The system of claim 12, the error checking value is a cyclic redundancy check value.

16. The system of claim 12, the general purpose DMA controller is capable of controlling DMA communication of data from at least one of a universal asynchronous transmitter-receiver, a memory controller, and a serial port interface.

17. The system of claim 12, a linear feedback shift register coupled to receive data from the general purpose DMA controller, the liner feedback shift register comprising a plurality of programmable polynomial building blocks.

18. The system of claim 17, the system further comprises a programmable shift register, the programmable shift register being programmable to shift different block sizes of data into the linear feedback shift register.

19. The system of claim 12, the polynomial equation includes a polynomial with a plurality of exponential terms, and wherein the system further comprises a polynomial register comprising a plurality of bits, each bit determining whether a particular exponential term is present in the polynomial of the polynomial equation.

* * * * *